(12) United States Patent
Bisbikis et al.

(10) Patent No.: US 7,692,932 B2
(45) Date of Patent: Apr. 6, 2010

(54) RESILIENT GROUNDING CLIP IN ELECTRONICS CHASSIS

(75) Inventors: Steve Bisbikis, Hawthorn Woods, IL (US); Steve Koo, Chicago, IL (US); Todd Collis, Hoffman Estates, IL (US)

(73) Assignee: Flextronics AP, LLC, Broomfield, CO (US)

( * ) Notice: Subject to any disclaimer, the term of this patent is extended or adjusted under 35 U.S.C. 154(b) by 643 days.

(21) Appl. No.: 11/687,447

(22) Filed: Mar. 16, 2007

(65) Prior Publication Data

US 2007/0217172 A1 Sep. 20, 2007

Related U.S. Application Data

(60) Provisional application No. 60/743,538, filed on Mar. 17, 2006.

(51) Int. Cl.
*H05K 9/00* (2006.01)

(52) U.S. Cl. .................. 361/799; 361/753; 361/816; 361/818; 361/800; 174/350; 174/351; 174/355; 174/354; 174/366

(58) Field of Classification Search ............ 361/753, 361/799, 800, 816, 818; 174/350, 351, 354, 174/355, 362, 366
See application file for complete search history.

(56) References Cited

U.S. PATENT DOCUMENTS

| | | | | |
|---|---|---|---|---|
| 4,186,981 A | * | 2/1980 | Holton | .................. 439/92 |
| 4,631,641 A | * | 12/1986 | Brombal et al. | ............. 361/818 |
| 5,029,254 A | * | 7/1991 | Stickney | .................. 174/354 |
| 5,043,528 A | * | 8/1991 | Mohr | ......................... 174/355 |
| 5,653,596 A | | 8/1997 | Banakis et al. | |
| 5,934,915 A | * | 8/1999 | Henningsson et al. | ......... 439/92 |
| 6,080,930 A | * | 6/2000 | Lommen et al. | ............ 174/355 |
| 6,204,444 B1 | * | 3/2001 | Pugliese et al. | ............. 174/358 |
| 6,283,770 B1 | * | 9/2001 | Leung et al. | .................. 439/92 |
| 6,456,504 B1 | | 9/2002 | Loforte et al. | |
| 6,574,121 B1 | * | 6/2003 | Franz et al. | .................. 361/825 |
| 6,997,722 B2 | * | 2/2006 | Mangold | .................... 439/92 |
| 7,042,737 B1 | * | 5/2006 | Woolsey et al. | ............. 361/799 |
| 7,263,756 B2 | * | 9/2007 | Sosnowski | .................... 29/446 |
| 2008/0011510 A1 | * | 1/2008 | Tang et al. | .................. 174/350 |

* cited by examiner

*Primary Examiner*—Dameon E Levi
(74) *Attorney, Agent, or Firm*—Robert G. Crouch; Marsh Fischmann & Breyfogle, LLP

(57) ABSTRACT

The devices and methods herein provide ground for computer cards inserted into a computer card chassis (e.g., VME chassis, CompactPCI chassis, ATCA chassis, etc.). A resilient clip may be configured with a chassis member of the computer card chassis. The clip is affixed to the computer card chassis and maintains contact with a ground plane, such as an ESD shield. The clip may have a self locking mechanism which insurers that the clip resides at a fixed position with the chassis member. A computer card may then be inserted into the computer card chassis and thereby make contact with the resilient clip. The computer card may include a ground pin which inserts through an aperture within the chassis member to make contact with the resilient clip. Accordingly, the inserted computer card may be provided with ESD protection as well as a ground reference potential from the computer card chassis.

26 Claims, 8 Drawing Sheets

US 7,692,932 B2

RESILIENT GROUNDING CLIP IN ELECTRONICS CHASSIS

CROSS-REFERENCE RELATED APPLICATIONS

This patent application is related to and claims priority from U.S. Provisional Patent Application No. 60/743,538 (filed Mar. 17, 2006 and entitled "Resilient Grounding Clip in Electronic Chassis"), the entire contents of which are incorporated within by reference.

BACKGROUND

Modern electronics, such as telecommunications equipment, are commonly contained in a housing or chassis that may or may not be mounted in a standard sized rack. The chassis may serve many functions, including providing structural support for the contents, providing a common electrical ground, providing protection from electromagnetic interference (EMI), and others.

Within certain industries, there are standards organizations that have promulgated specifications for certain types of electronics chassis. One example of such an organization is the PCI Industrial Computer Manufacturers Group (PICMG) and an example of such a specification is PICMG 3.0 Rev. 1.0 or as further updated, more commonly known as the Advanced Telecom Computing Architecture (ATCA) specification.

Along with voluminous other requirements, the ATCA specification specifies the mechanical configuration of a backplane within a housing, the number, size, and relative spacing of circuit boards (referred to as computer cards) that are retained within the housing and which electrically connect to the backplane. The ATCA specification also specifies the characteristics of the circuit ground provided for the computer cards, and the cooling and air filtering requirements for the housing.

The foregoing examples of the related art and limitations related therewith are intended to be illustrative and not exclusive. Other limitations of the related art will become apparent to those of skill in the art upon a reading of the specification and a study of the drawings.

SUMMARY

Generally, the devices and methods described herein provide a ground reference potential for computer cards inserted into a computer card chassis. Examples of computer card chassis include VME chassis, CompactPCI chassis, and ATCA chassis. In one embodiment, a resilient clip is configured with a chassis member of the computer card chassis. The clip is affixed to the computer card chassis and maintains contact with a ground plane, such as an ESD shield. The clip may have a self locking mechanism which insurers that the clip resides at a fixed position is with the chassis member. A computer card may then be inserted into the computer card chassis and thereby make contact with the resilient clip. In this regard, the computer card may include a ground pin which inserts through an aperture within the chassis member to make contact with the resilient clip. Accordingly, the inserted computer card may be provided with ESD protection as well as a ground reference potential from the computer card chassis.

In one embodiment, a computer card chassis includes an EMI shield and a chassis member for retaining computer cards. The chassis member has at least a first aperture and a second aperture. The computer card chassis also includes a ground clip that is attached to the chassis member via the first aperture and that contacts the EMI shield. The ground clip extends from the first aperture along a first side of the chassis member around an edge of the chassis member and onto a second side of the chassis member. The attachment of the ground clip maintains contact between the ground clip and the second side of the chassis member. The second aperture is configured for receiving a pin from a computer card inserted into the computer card chassis such that the pin contacts the ground clip. The second aperture may provide guidance for the inserted computer card.

The ground clip may be configured from a resilient material such that the ground clip resists pressure from the pin to maintain contact with the pin. The resilient material may be spring steel, plated steel, beryllium, or a combination thereof. Alternatively or additionally, the ground clip may include a ground clip aperture through which the pin passes, wherein the ground clip resists pressure from the pin to maintain contact with the pin about an edge portion of the ground clip aperture.

The computer card chassis may further include another chassis member configured within the computer card chassis such that the inserted computer card is substantially perpendicular to the chassis members.

In another embodiment, an ATCA chassis includes a first chassis member and a second chassis member with each chassis member having a plurality of ATCA card mounting apertures. The first chassis member includes a plurality of pin apertures each configured for receiving a pin of an ATCA card that is inserted into the ATCA chassis between the first chassis member and the second chassis member. The ATCA chassis also includes a ground plane proximate to the first chassis member and a ground clip that attaches to the first chassis member proximate to one of the pin apertures and contacts the ground plane. The pin from the inserted ATCA card contacts the ground clip.

The ground clip may have a tab and the first chassis member may have a point of attachment to which the tab is attached. In this regard, the ground clip extends from the point of attachment along a first side of the chassis member around of an edge of the chassis member and onto a second side of the chassis member.

The ground clip may be configured from a resilient material (e.g., spring steel, plated steel, beryllium, or a combination thereof) that resists pressure from the pin of the inserted ATCA card. The point of attachment may be a slot aperture in which the tab is inserted. The ground clip may include a ground clip aperture through which the pin passes, wherein the ground clip resists pressure from the pin to maintain contact with the pin about an edge portion of the ground clip aperture.

In another embodiment, a method of configuring an ATCA chassis includes providing a first chassis member and a second chassis member. Each chassis member may have a plurality is of ATCA card mounting points and wherein at least the first chassis member has a plurality of pin apertures. The method also includes providing at least two ATCA cards. Each ATCA card may be configured with at least one pin and at least two mounting connectors. The method also includes providing an EMI shield proximate to the first chassis member and providing at least two ground clips with the first chassis member such that the ground clips maintain contact with the first chassis member and the EMI shield. Each of the at least two ground clips is configured proximate to one of the pin apertures. The method also includes inserting a first of the at least two ATCA cards into the ATCA chassis by guiding the at least one pin of the first ATCA card through a first corresponding number of pin apertures such that the at least one pin of the first ATCA card contacts a first of the at least two ground clips and guiding the at least two mounting connectors of the first ATCA card to a first mounting point of the first chassis member and a first mounting point of the second chassis member. The method also includes inserting a second of the at least two ATCA cards into the ATCA chassis by guiding the at least one pin of the second ATCA card through a second corresponding number of pin apertures such that the at least one pin of the second ATCA card contacts a second of the at least two ground clips and guiding the at least two mounting connectors of the second ATCA card to a second mounting point of the first chassis member and a second mounting point of the second chassis member.

The method may further include inserting a first of the at least two ATCA cards into the ATCA chassis includes guiding the at least one pin of the first ATCA card through a ground clip aperture of the first ground clip. The method may further include providing the at least two ground clips includes attaching a tab of the first ground clip to a slot configured with the first chassis member, wherein the first ground clip extends from the slot along a first side of the first is chassis member around an edge of the first chassis member and onto a second side of the chassis member. The first ground clip may be configured from a resilient material and includes a first bend (e.g., a curved portion) for positioning on the second side of the first chassis member. In this regard, the at least one pin of the first ATCA card may contact the first bend when the first ATCA card is inserted into the ATCA chassis.

The mounting connectors of the ATCA card may be mounting screws and the plurality of ATCA card mounting points may include a plurality of ATCA card mounting apertures. Alternatively, the mounting connectors of the ATCA card and the ATCA card mounting points provide ball and socket connections.

In another embodiment, a computer card chassis includes a ground plane and a first chassis member configured proximate to the ground plane the chassis member may include a connection means configured for providing a ground potential from the ground plane to an inserted computer card. The computer card chassis also includes a second chassis member such that the inserted computer card is retained between the first chassis member and the second chassis member. The connection means is configurable either as a ground clip and pin receptacle or as a ground clip receptacle.

Again, the ground clip may be configured of a resilient material that is attached to the first chassis member. The ground clip may include a tab that attaches the ground clip to the first chassis member via an opening in the first chassis member. In this regard, the ground clip extends from the opening along a first side of the first chassis member, around an edge of the first chassis member, and onto a second side of the first chassis member.

The pin receptacle may be configured for receiving a pin of the inserted computer card. In this regard, the pin of the inserted computer card contacts the ground clip and the resilient material of the ground clip induces the ground clip to maintain contact with the pin.

The ground clip receptacle may be configured for receiving a ground clip configured with the inserted computer card. In this regard, the ground clip receptacle induces the ground clip to contact the ground plane of the computer card chassis. The ground clip receptacle may include a pin for deflecting the ground clip towards the ground plane.

BRIEF DESCRIPTION OF THE DRAWINGS

Exemplary embodiments are illustrated in referenced figures of the drawings. It is intended that the embodiments and figures disclosed herein be considered illustrative rather than limiting.

DETAILED DESCRIPTION

Reference will now be made to the accompanying drawings, which assist in illustrating the various pertinent features of the present invention. Although the present invention will now be described primarily in conjunction with electronics chassis, it should be expressly understood that the present invention may be applicable to other applications where it is desired to achieve an improved grounding connection. In this regard, the following description of an electronics chassis is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

Figure 1:
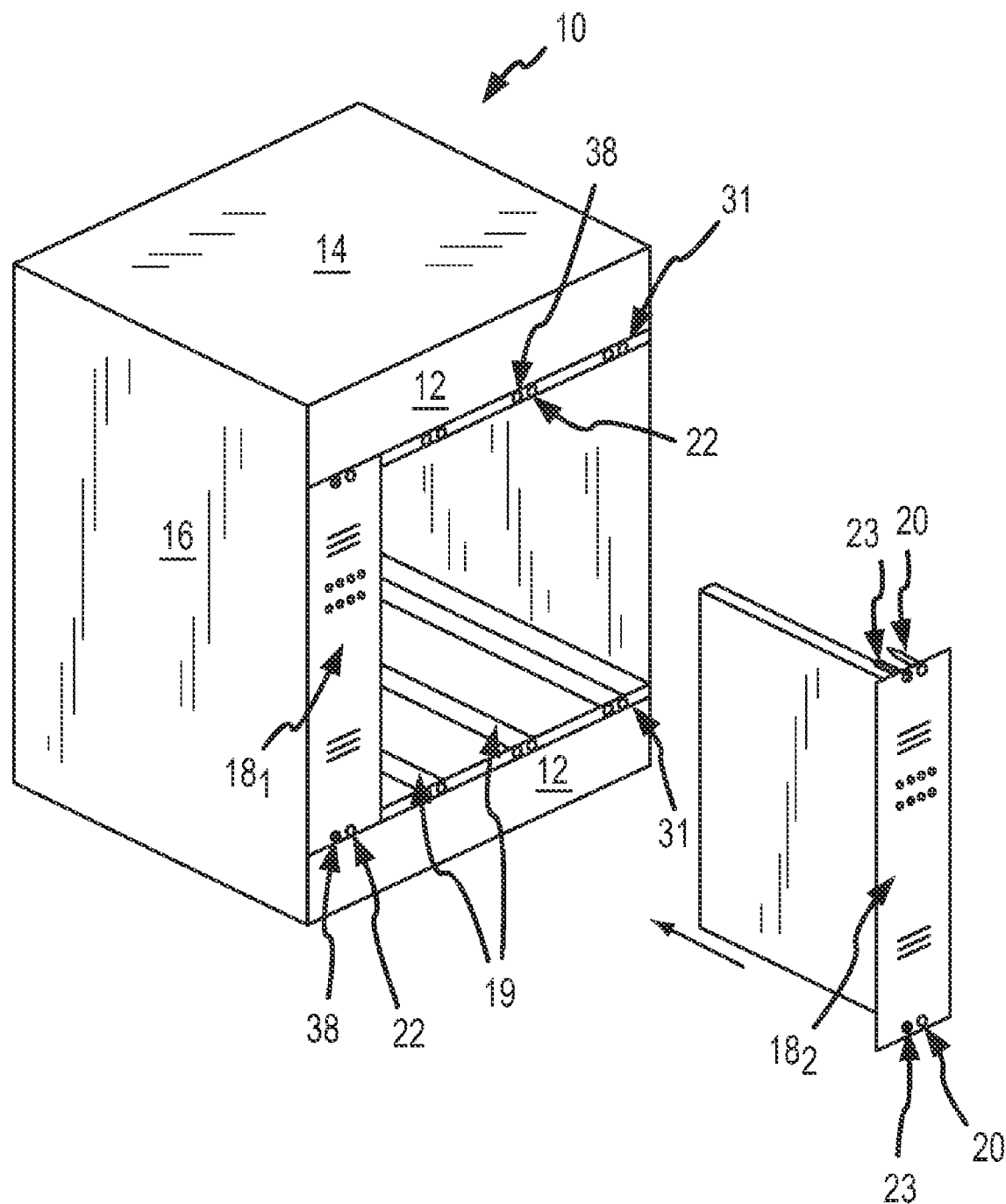
FIG. 1 is a side view of an electronics chassis and a computer card that is insertable into the chassis.

The computer card chassis 10 shown in FIG. 1 includes a housing having a front wall is 12, a top wall 14, and a pair of lateral side walls 16. Contained within the housing are a plurality of computer cards 18 (e.g., telecommunication circuit cards as used in an ATCA chassis). Typically, the computer card chassis 10 also includes a back panel (not shown) that includes components for providing, among other things, power to computer cards 18 inserted into the computer card chassis. For example, the back panel may include circuitry for power interface and distribution, for control of fans, and for management of all of the other circuitry within the housing. As can be seen, one computer card $18_1$ is shown inserted into the chassis 10 and one computer card $18_2$ is not currently inserted. The chassis 10 includes internal structure such as tracks 19 for receiving the computer cards 18, openings 22 and 38 for receiving grounding pins 20 and mounting screws 23, respectively, associated with the computer cards 18.

It should be noted that the invention is not intended be limited to computer cards 18 having grounding pins 20 for guided insertion into the chassis 10 via the openings 22. For example, other embodiments, such as that shown and described below in FIG. 9B, may include the computer card 18 having a grounding clip configured in a manner similar to the grounding clip 24. In this regard, the chassis 10 may include a grounding clip receptacle which enables the grounding clip to receive a ground potential.

Figure 2:
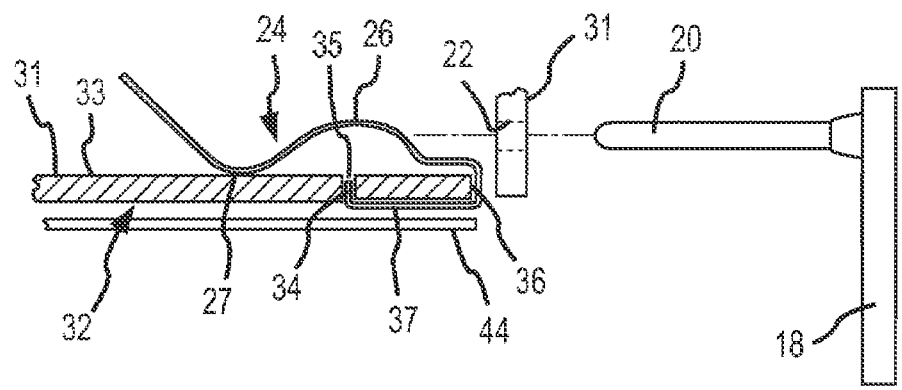
FIG. 2 is an enlarged side view of portions of the chassis and computer card of FIG. 1, showing a grounding pin of the computer card engaging with a resilient clip of the chassis.

FIG. 2 shows a portion of one of the computer cards 18 and a grounding pin 20 thereon. When the computer card 18 is fully inserted into the chassis 10, the pin 20 is received through an opening 22 defined in the internal structure of the chassis 10 (i.e., the chassis member 31). In such an inserted position, the pin 20 contacts a resilient clip 24 retained by the chassis member 31 in the chassis 10. The clip 24 may be constructed of spring steel, beryllium, or plated steel, or any other suitable material. The clip 24 has a curved portion 26 that is designed to contact the is pin 20. The clip 24 also has a self-locking tab 34 at one end thereof that is received in an opening 35 (e.g., a slot) defined in the chassis member 31 of the chassis 10. The portion of the chassis member 31 containing the opening 35 is shown in greater detail in FIG. 5.

In this embodiment, the self locking tab 34 of the clip 24 inserts through the opening 35 and extends from the opening 35 along the side 32 of the chassis member 31. The clip 24 further raps about the edge 36 of the chassis member 31 and onto the side 33 of the chassis member 31. The clip 24 is preformed with the curved portions 26 and 27 such that the clip 24 maintains contact with the side 33 of the chassis member 31. For example, the resilient nature of the clip 24 may provide a downward pressure onto the side 33 of the chassis member 31 such that the clip 24 maintains contact with the chassis member 31.

As the computer card 18 is inserted into the chassis 10 (i.e., of FIG. 1), the pin 20 is guided through the opening 22 of the chassis member 31. In the completely inserted position of the computer card 18, the pin 20 makes contact with the curved portion 26 of the clip 24. In this regard, the pin 20 exerts force on the curved portion 26 pushing the curved portion 26 downward. Again, the resilient nature of the clip 24 causes the clip to maintain contact with the pin 20 after the computer card 18 has reached its final inserted position within the chassis 10. This action is shown in greater detail below in FIGS. 6A-6C.

Also illustrated in FIG. 2 is the ESD plane 44. The ESD plane 44 may be configured proximate to the side 32 of the chassis member 31 to provide ESD protection and/or a ground reference potential to, for example, the computer card 18. For example, the ESD plane 44 may be positioned at the bottom of the computer card chassis 10 of FIG. 1 underneath the chassis member 31. Accordingly, the ESD plane 44 and the chassis member 31 may "sandwich" the flat is portion 37 of the clip 24 such that the clip maintains contact with the chassis member 31 and the ESD plane 44. This contact by the clip 24 may thereby provide ground to the chassis member 31 as well as the computer card 18 via the pin 20.

Figure 3:
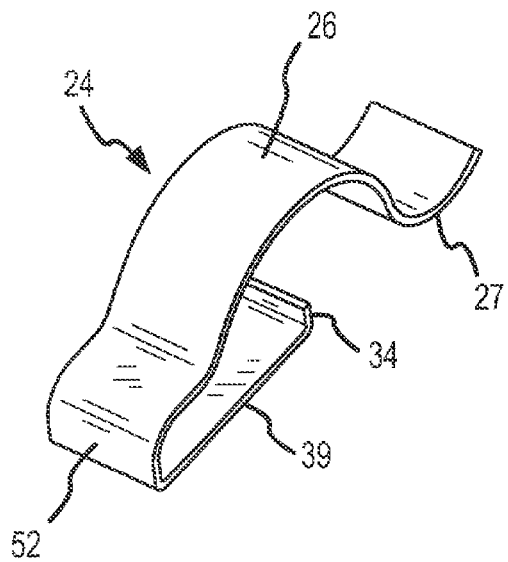
FIG. 3 is a perspective view of the resilient clip of FIG. 2.
Figure 4:
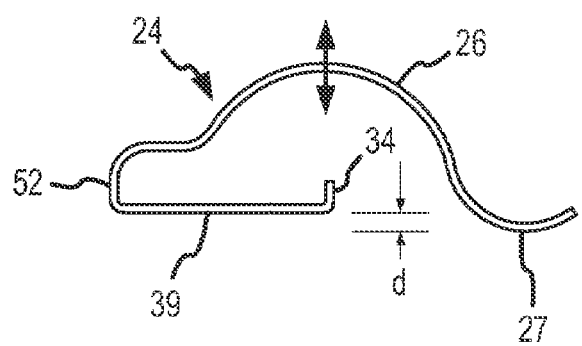
FIG. 4 is a side view of the resilient clip of FIG. 2.

FIG. 3 is a perspective view of the resilient clip 24 of FIG. 2 and FIG. 4 is a side view of the clip. These views show how the clip 24 may be configured to attach to the chassis member 31. The clip 24 is "slid" onto the chassis member 31 until the tab 34 inserts into the opening 35 of the chassis member. As shown in this embodiment, the tab has a relatively slender rectangular shape as it folds up due to the thickness of the material. In this regard, the opening 34 may be a thin slot in which the tab 34 inserts, thereby locking the clip 24 into place upon the chassis member 31. Other embodiments may have the tab 34 configured as a relatively narrow tip that inserts, for example, into a circular aperture configured within the chassis member 31.

Also seen in this embodiment, particularly in FIG. 4, the curved portion 27 of the tab 24 is configured at a depth d lower than the flat portion 39 of the clip 24. This configuration assists the clip 24 in maintaining a locked position upon the chassis member 31. That is, the clip 24 is "self-locking" when the tab is inserted into the opening 35 in the chassis member 31. The curved portion 27 applies pressure upon side 33 of the chassis member 31 which, in turn, forces the tab 34 to remain inserted within the opening 35.

Figure 5:
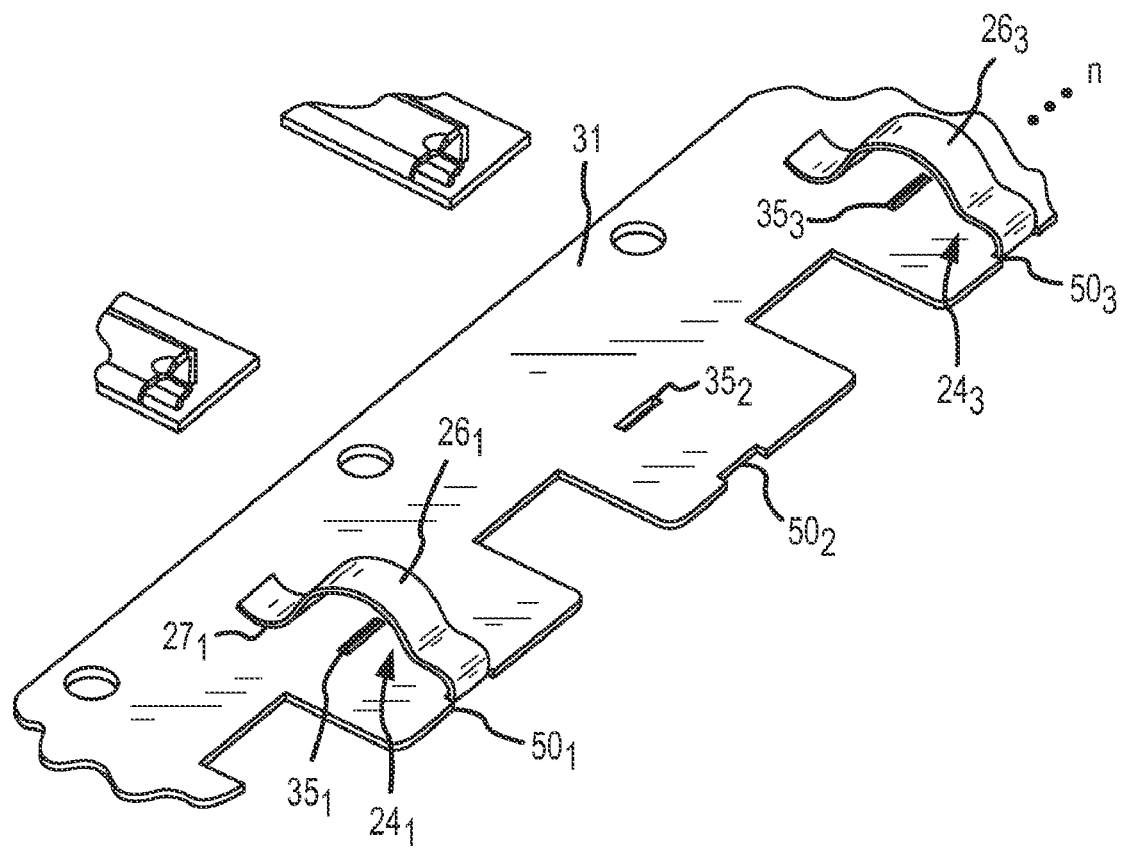
FIG. 5 is a perspective view of a portion of the internal structure of the electronics chassis of FIGS. 1 and 2, showing the arrangement by which the resilient clip of FIG. 2 is retained therein.

FIG. 5 is a perspective view of a portion of the chassis member 31 of FIGS. 1 and 2, showing the arrangement by which the resilient clip of FIG. 2 is retained thereon. For example, the portion of the chassis member 31 on which a plurality of clips 24 may be configured with the corresponding number of grooves $50_{1 \ldots n}$ (where n is an integer greater than 1). As the clip 24 slides into opening 35, a folded portion 52 of the clip 24 is further locked into is place via the grooves $50_{1 \ldots n}$ and by the force at curved portion created by the resiliency of the material of the clip.

Figure 6C:
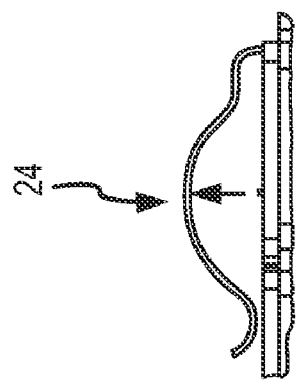
FIGS. 6A-6C are side views of the resilient clip both in and out of engagement with the grounding pin.
Figure 6B:
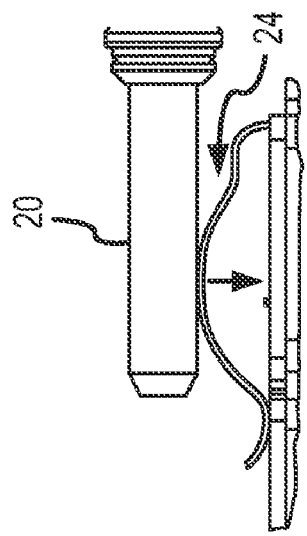
Figure 6A:
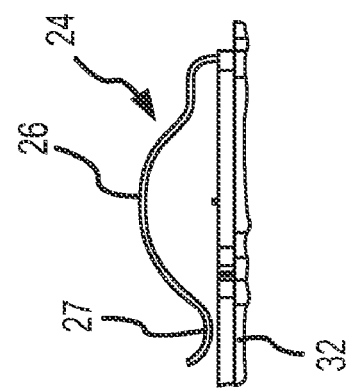

Turning now to FIGS. 6A-6C, side views of the resilient clip 24 as affixed to the chassis member 31 are illustrated both in and out of engagement with the grounding pin 20. In FIG. 6A the clip 24 is in a first (or rest) position when it is not contacted by the pin 20. FIG. 6B shows the curved portion 26 of the clip 24 slightly straightened out as the pin 20 forces the clip 24 out of its rest position. Additionally, the downward force caused by the pin 20 forces the curved portion 27 to maintain contact with the side 33 of the chassis member 31. FIG. 6C shows the clip 24 after it has sprung back to its rest position due to the resilient nature of the clip 24, such as when the computer card 18 is removed from the chassis 10. Additionally, the downward force by the pin 20 may cause the curved portion 27 of the clip 24 to slide laterally along the side 33 of the chassis member 31. Those skilled in the art should readily recognize that the curved portion 27 may be in continuous contact with the side 33 of the chassis member 31 regardless of the presence of the pin 20.

Figure 7A:
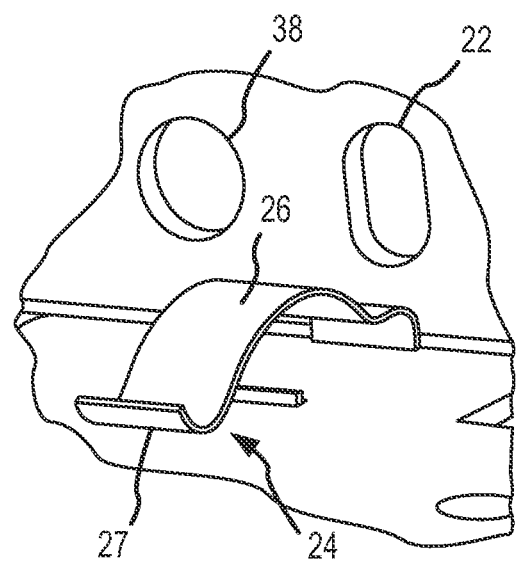
FIGS. 7A and 7B are perspective views of the resilient clip both in and out of engagement with the grounding pin.
Figure 7B:
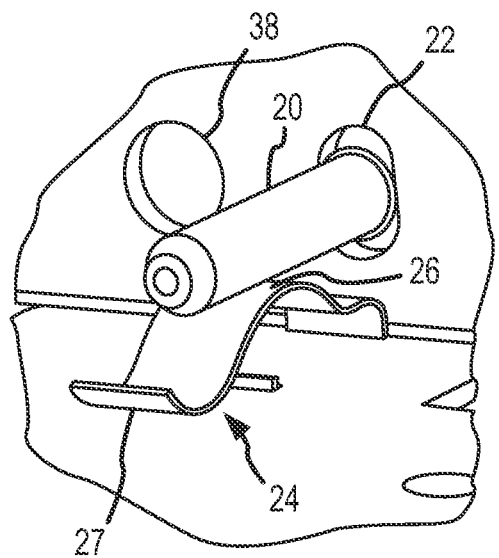

FIGS. 7A and 7B show perspective views of the chassis member 31 employing a pair of openings 38 and 22. More specifically, FIG. 7A illustrates the chassis member 31 with the grounding clip 24 in place prior to the insertion of the computer card 18 into the chassis 10. FIG. 7B shows the contact made by the pin 20 once the computer card 18 has been completely inserted into the chassis 10. In this regard, the opening 22 receives the pin 20 as the computer card 18 is inserted into the chassis 10. The pin 20 and the corresponding opening 22 may serve to guide the computer card 18 into a fixed position. As the computer card 18 completely inserts into the chassis 10, the pin 20 comes into contact with the curved portion 26 of the clip 24.

The opening 38 is provided to receive a screw (not shown) for retaining the computer card 18 in position. For example, a mounting screw (e.g., mounting screw 23 of FIGS. 1 and 9A) may be configured with the computer card 18 proximate to the pin 20 such that the mounting screw inserts through the opening 38 upon insertion of the computer card 18. The mounting screw may be used to rigidly affix the computer card 18 within the chassis 10, thereby preventing vibrational damage to the computer card 18. Those skilled in the art, however, should readily recognize that the invention is not intended to be limited to mounting screws for use in rigidly affixing the computer card 18 within the chassis 10. For example, other mechanical connections, such as "clips" or ball and socket connections, may also be used to rigidly affix the computer card within the chassis 10.

As can be appreciated, the resilient nature of the clip 24 causes it to be urged against the pin 20 when in the position shown in FIGS. 6B and 7B. This causes solid mechanical contact between the pin 20 and the clip 24. As the clip 24 and the pin 20 are likely to be configured of a conductive material, the solid mechanical contact between the pin 20 and the clip 24 generally results in a relatively good, low-resistance connection between the pin 20 and the clip 24. Accordingly, the clip 24 can be connected to electrical ground via the chassis member 31. For example, a ground plane (e.g., an electrostatic discharge shield, or ESD shield) may be configured proximate to the side 32 of the chassis member 31 so as to contact the ground clip 24. Such may allow the computer card 18 to be grounded from ESD as well as providing a ground reference potential to components of the computer card. Alternative ground paths for grounding the computer cards 18 may also be implemented with the chassis 10.

Figure 8A:
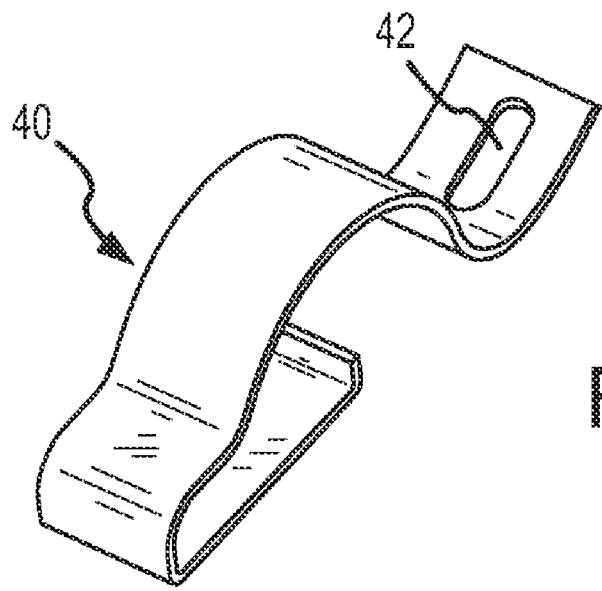
FIGS. 8A and 8B are perspective and side views, respectively, of an alternative embodiment of a resilient clip, with FIG. 8B showing the clip engaged with a grounding pin.
Figure 8B:
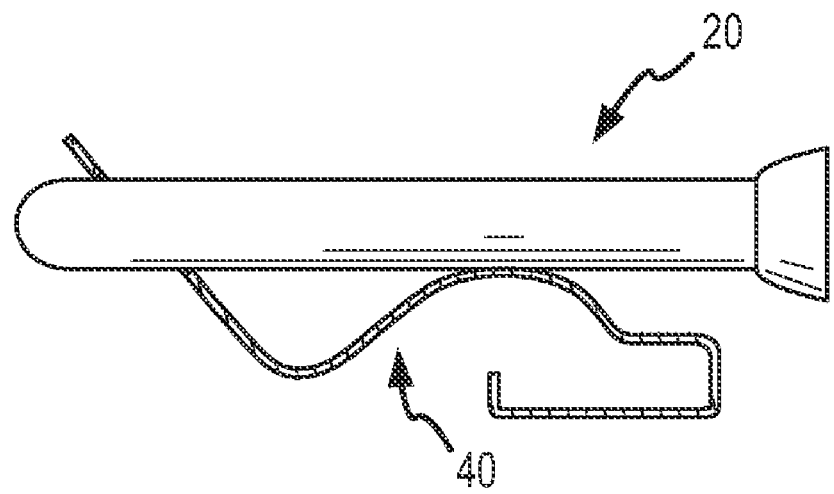

An alternative embodiment is shown in FIGS. 8A and 8B. In this embodiment, a is resilient clip 40 is used that has an opening 42 defined therein. The principal design and operation of the clip 40 are similar to that of clip 24. However, in this embodiment, the clip 40 further ensures contact with the pin 20 by allowing the pin to pass through the opening 42. That is, as can be seen in FIG. 8B, when the computer card 18 is fully inserted, the pin 20 is received in the slot 42 to provide additional mechanical contact in the form of an interference fit between the pin 20 and the clip 40.

Figure 9A:
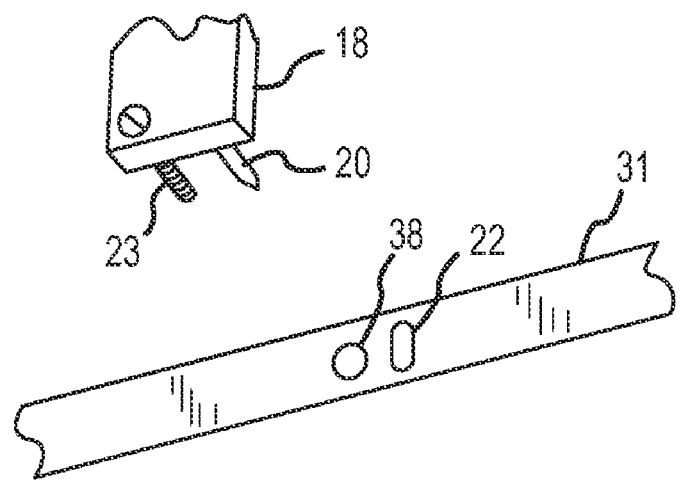
FIGS. 9A and 9B illustrate close-up views of two embodiments of a computer card being inserted into a chassis member.
Figure 9B:
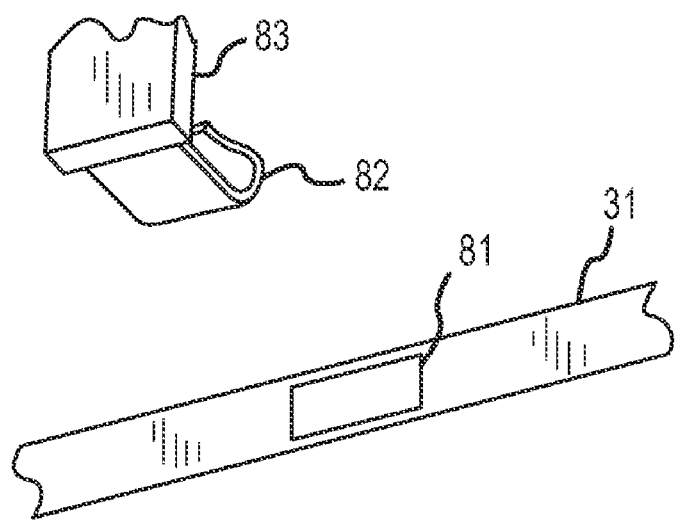

FIGS. 9A and 9B illustrate close-up views of two embodiments of a computer card being inserted into a chassis member. For example, FIG. 9A illustrates the mounting screw 23 and pin 20 for insertion into apertures 38 and 22, respectively. The mounting screw 23 and the pin 20 are configured with the top and bottom portions of the computer card 18 as shown in FIG. 1. FIG. 9B illustrates an alternative embodiment. Instead of using mounting screws and pins such as that shown in FIG. 9A, computer card 83 is configured with a clip 82 similar to the clip 24 described hereinabove. In this regard, the chassis member 31 may be configured with a slot 81 as opposed to the apertures 38 and 22 such that the clip 82 snaps into the slot 81 to rigidly affix the computer card 83 to the chassis member 31. Like the clip 24, the clip 82 may provide a ground connection to the computer card by coupling to a ground point configured within the chassis member 31. For example, the chassis member 31 may include a pin such as pin 20 that presses against (e.g., deflects) the clip 82 as it is inserted into the slot 81. The pin may be coupled to a ground reference potential (e.g., the ESD plane 44 of FIG. 2) to provide such to the computer card 83.

Figure 10:
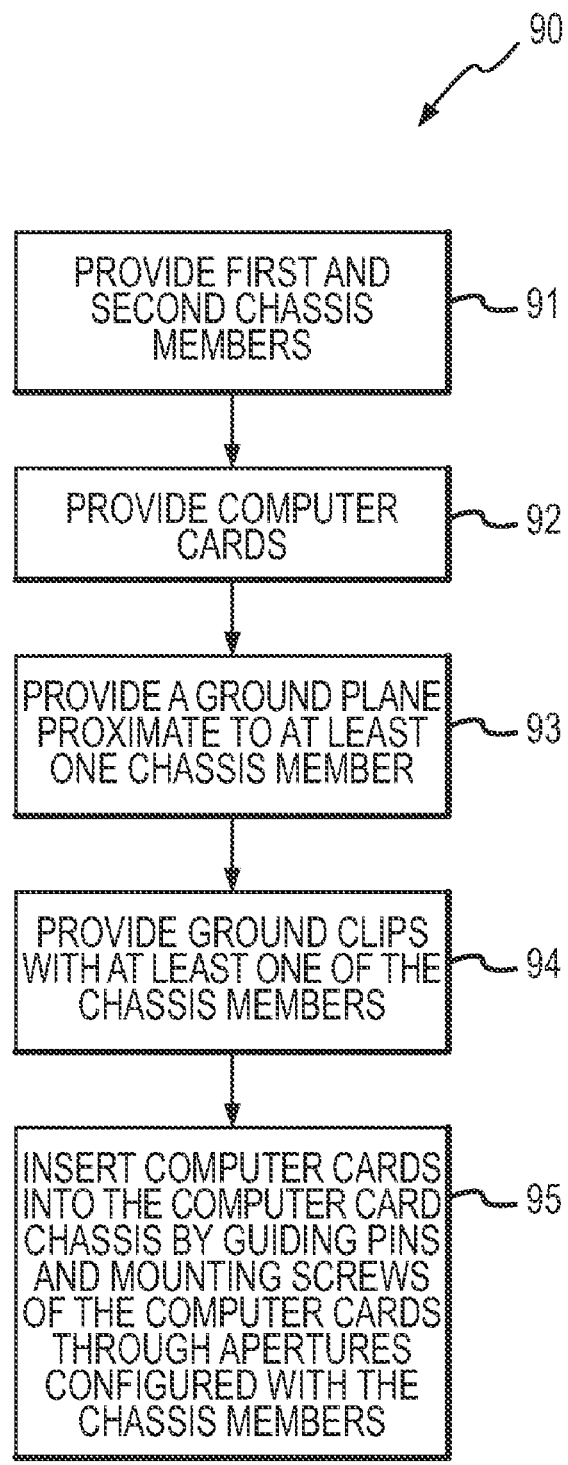
FIG. 10 illustrates a flow chart of a process for configuring a computer card chassis.

FIG. 10 illustrates a process 90 for configuring a computer card chassis, such as computer card chassis 10 of FIG. 1. First and second chassis members are provided in process is element 91. These chassis members may be configured with apertures that provide insertion mounts and grounding capabilities. For example, the chassis member may include a plurality of mounting screw apertures or other means for rigidly affixing computer cards within the computer card chassis. Additionally, the chassis members may be configured with apertures for receiving pins from a computer card. For example, the computer card may include guide pins that are inserted into the apertures of the chassis members to guide the computer card into a position for mounting by means of the mounting fixtures (e.g., the mounting screws). In this regard, the computer cards are provided in process element 92 for insertion into the computer card chassis.

The guide pins may also provide a means for receiving a ground reference potential from the computer card chassis. For example, the computer card says he may be configured with a ground plane, such as an EMI shield, that protects the inserted computer card from electromagnetic interference and/or provides a ground reference potential for components on the computer card. In this regard, an EMI shield or ground plane may be configured proximate to a least one of the chassis members, in process element 93. To provide the EMI protection and/or ground reference potential to the computer cards, the computer card chassis members may be configured with a plurality of ground clips. For example, the ground clips may be provided, in process element 94, to one or more the chassis members by a self locking means of insertion into an aperture within a chassis member. Examples of such are shown and described with ground clips 24 and 40 of FIGS. 2 and 8A, respectively. With the ground clips in place, the computer cards may be inserted into the computer card chassis by guiding the pins of the computer card into their associated apertures within the chassis members, in process element 95. Once inserted, the pins of the computer cards may press against the ground clips. The resilient material of the ground clips, as described hereinabove, forces the ground clips to maintain contact with the ground pins upon insertion of the computer cards. Once inserted, the mounting screws may also be inserted through the mounting screw apertures of the chassis members to rigidly affix the computer cards within the computer card chassis.

Although shown and described with respect to a particular embodiment having mounting screws and guide pins associated with the computer cards, those skilled in the art should readily recognize that the process 90 may incorporate any of the mounting or ground clip combinations described hereinabove. Additionally, the process 90 is not intended to be limited to any particular type of computer card chassis. For example, the process 90 may be used to configure computer card chassis such as ATCA, CompactPCI, VME, or any other suitable computer card chassis configuration.

Any other combination of all the techniques discussed herein is also possible. The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. It is therefore intended that the following appended claims and claims hereafter introduced are interpreted to include all such variations, modifications, permutations, additions, and sub-combinations as are within their true spirit and scope.

What is claimed is:

1. A computer card chassis, including:
   an EMI shield;
   a chassis member for retaining computer cards, wherein the chassis member has at least a first aperture and a second aperture; and
   a ground clip that is attached to the chassis member via the first aperture and that contacts the EMI shield, wherein the ground clip extends from the first aperture along a first side of the chassis member around an edge of the chassis member and onto a second side of the chassis member, wherein the attachment of the ground clip maintains contact between the ground clip and the second side of the chassis member,
   wherein the second aperture is configured for receiving a pin from a computer card inserted into the computer card chassis such that the pin contacts the ground clip.

2. The computer card chassis of claim 1, wherein the ground clip is configured from a resilient material such that the ground clip resists pressure from the pin to maintain contact with the pin.

3. The computer card chassis of claim 2, wherein the resilient material is spring steel, plated steel, beryllium, or a combination thereof.

4. The computer card chassis of claim 1, wherein the computer card chassis is: an Advanced Telecom Computing Architecture chassis; a Compact Peripheral Component Interconnect chassis; or a Virtual Machine Environment chassis.

5. The computer card chassis of claim 1, further comprising another chassis member configured within the computer card chassis such that the inserted computer card is substantially perpendicular to the chassis members.

6. The computer card chassis of claim 1, wherein the ground clip includes a ground clip aperture through which the pin passes, wherein the ground clip resists pressure from the pin to maintain contact with the pin about an edge portion of the ground clip aperture.

7. The computer card chassis of claim 1, wherein the second aperture provides guidance for the inserted computer card.

8. An ATCA chassis, including:
a first chassis member and a second chassis member, each chassis member having a plurality of ATCA card mounting apertures, wherein at least the first chassis member includes a plurality of pin apertures each configured for receiving a pin of an ATCA card that is inserted into the ATCA chassis between the first chassis member and the second chassis member;
a ground plane proximate to the first chassis member;
a ground clip that attaches to the first chassis member proximate to one of the pin apertures and contacts the ground plane, wherein the pin from the inserted ATCA card contacts the ground clip.

9. The ATCA chassis of claim 8, wherein the ground clip has a tab and the first chassis member has a point of attachment to which the tab is attached, wherein the ground clip extends from the point of attachment along a first side of the chassis member around of an edge of the chassis member and onto a second side of the chassis member.

10. The ATCA chassis of claim 9, wherein ground clip is configured from a resilient material that resists pressure from the pin of the inserted ATCA card.

11. The ATCA chassis of claim 9, wherein the resilient material is spring steel, plated steel, beryllium, or a combination thereof.

12. The ATCA chassis of claim 9, wherein the point of attachment is a slot aperture in which the tab is inserted.

13. The ATCA chassis of claim 8, wherein the ground clip includes a ground clip aperture through which the pin passes, wherein the ground clip resists pressure from the pin to maintain contact with the pin about an edge portion of the ground clip aperture.

14. A method of configuring an ATCA chassis, including:
providing a first chassis member and a second chassis member, wherein each chassis member has a plurality of ATCA card mounting points and wherein at least the first chassis member has a plurality of pin apertures;
providing at least two ATCA cards, wherein each ATCA card is configured with at least one pin and at least two mounting connectors;
providing an EMI shield proximate to the first chassis member;
providing at least two ground clips with the first chassis member such that the ground clips maintain contact with the first chassis member and the EMI shield, wherein each of the at least two ground clips is configured proximate to one of the pin apertures;
inserting a first of the at least two ATCA cards into the ATCA chassis by guiding the at least one pin of the first ATCA card through a first corresponding number of pin apertures such that the at least one pin of the first ATCA card contacts a first of the at least two ground clips;
guiding the at least two mounting connectors of the first ATCA card to a first mounting point of the first chassis member and a first mounting point of the second chassis member;
inserting a second of the at least two ATCA cards into the ATCA chassis by guiding the is at least one pin of the second ATCA card through a second corresponding number of pin apertures such that the at least one pin of the second ATCA card contacts a second of the at least two ground clips; and
guiding the at least two mounting connectors of the second ATCA card to a second mounting point of the first chassis member and a second mounting point of the second chassis member.

15. The method of claim 14, wherein inserting a first of the at least two ATCA cards into the ATCA chassis includes guiding the at least one pin of the first ATCA card through a ground clip aperture of the first ground clip.

16. The method of claim 14, wherein providing the at least two ground clips includes attaching a tab of the first ground clip to a slot configured with the first chassis member, wherein the first ground clip extends from the slot along a first side of the first chassis member around an edge of the first chassis member and onto a second side of the chassis member.

17. The method of claim 16, wherein the first ground clip is configured from a resilient material and includes a first bend for positioning on the second side of the first chassis member, wherein the at least one pin of the first ATCA card contacts the first bend when the first ATCA card is inserted into the ATCA chassis.

18. The method of claim 14, wherein the mounting connectors of the ATCA card are mounting screws and the plurality of ATCA card mounting points includes a plurality of ATCA card mounting apertures.

19. The method of claim 14, wherein the mounting connectors of the ATCA card and the ATCA card mounting points provide ball and socket connections.

20. A computer card chassis, including:
a ground plane;
a first chassis member configured proximate to the ground plane, wherein the chassis member includes a connection means configured for providing a ground potential from the ground plane to an inserted computer card;
a second chassis member, wherein the inserted computer card is retained between the first chassis member and the second chassis member,
wherein the connection means is configurable either as a ground clip and pin receptacle or as a ground clip receptacle.

21. The computer card chassis of claim 20, wherein the ground clip is configured of a resilient material and is attached to the first chassis member.

22. The computer card chassis of claim 21, wherein the ground clip includes a tab that attaches the ground clip to the first chassis member via an opening in the first chassis member.

23. The computer card chassis of claim 22, wherein the ground clip extends from the opening along a first side of the first chassis member, around an edge of the first chassis member, and onto a second side of the first chassis member.

24. The computer card chassis of claim 23, wherein the pin receptacle is configured for receiving a pin of the inserted computer card, wherein the pin of the inserted computer card contacts the ground clip and wherein the resilient material of the ground clip induces the ground clip to maintain contact with the pin.

25. The computer card chassis of claim 20, wherein the ground clip receptacle is configured for receiving a ground clip configured with the inserted computer card and wherein the ground clip receptacle induces the ground clip to contact the ground plane of the computer card chassis.

26. The computer card chassis of claim 25, wherein the ground clip receptacle includes a pin for deflecting the ground clip towards the ground plane.

* * * * *